(12) United States Patent
Ding et al.

(10) Patent No.: US 8,581,648 B2
(45) Date of Patent: Nov. 12, 2013

(54) HIGH FREQUENCY QUADRATURE PLL CIRCUIT AND METHOD

(71) Applicant: International Business Machines Corporation, Armonk, NY (US)

(72) Inventors: Hanyi Ding, Colchester, VT (US); Kai D. Feng, Hopewell Junction, NY (US); Zhenrong Jin, Essex Junction, VT (US); Francis F. Szenher, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/761,358

(22) Filed: Feb. 7, 2013

(65) Prior Publication Data

US 2013/0147530 A1    Jun. 13, 2013

Related U.S. Application Data

(63) Continuation of application No. 12/845,390, filed on Jul. 28, 2010.

(51) Int. Cl.
*H03L 7/06* (2006.01)

(52) U.S. Cl.
USPC .......................................... 327/157; 327/148

(58) Field of Classification Search
USPC ................................................ 327/148, 157
See application file for complete search history.

(56) References Cited

U.S. PATENT DOCUMENTS

| | | |
|---|---|---|
| 5,412,351 A | 5/1995 | Nystrom et al. |
| 5,724,008 A | 3/1998 | Ferraiolo et al. |
| 5,825,209 A | 10/1998 | Stark et al. |
| 6,047,383 A | 4/2000 | Self et al. |
| 6,064,869 A | 5/2000 | Davis et al. |
| 6,462,594 B1 | 10/2002 | Robinson et al. |
| 6,538,516 B2 | 3/2003 | Lenk |
| 6,693,987 B1 | 2/2004 | Hattori |
| 6,725,023 B2 | 4/2004 | Kasperkovitz |
| 6,744,277 B1 | 6/2004 | Chang et al. |
| 6,747,494 B2 | 6/2004 | Bushey et al. |
| 6,859,109 B1 | 2/2005 | Leung et al. |
| 6,914,491 B2 | 7/2005 | Derksen |
| 7,095,289 B2 * | 8/2006 | Knoll et al. ................... 331/185 |
| 7,420,870 B2 | 9/2008 | Park et al. |
| 7,548,591 B2 | 6/2009 | Parsa et al. |
| 7,558,543 B2 | 7/2009 | Isaac et al. |
| 7,589,597 B2 * | 9/2009 | Chang et al. .................... 331/37 |

(Continued)

OTHER PUBLICATIONS

Tormanen, "A 24-GHz LC-QVCO in 130-nm CMOS Using a 4-Bit Switched Tuning", International Conference in Microelectronics, 2008, pp. 462-465.

*Primary Examiner* — Adam Houston
(74) *Attorney, Agent, or Firm* — David Cain; Roberts Mlotkowski Safran & Cole, P.C.

(57) ABSTRACT

A method includes phase-shifting an output signal of a phase lock loop (PLL) circuit by applying an injection current to an output of a charge pump of a the PLL circuit. A circuit includes: a first phase lock loop (PLL) circuit and a second PLL circuit referenced to a same clock; a phase detector circuit that detects a phase difference between an output signal of the first PLL circuit and an output signal of the second PLL circuit; and an adjustable current source that applies an injection current to at least one of the first PLL circuit and the second PLL circuit based on an output of the phase detector circuit.

15 Claims, 7 Drawing Sheets

(56) References Cited

U.S. PATENT DOCUMENTS

| | | |
|---|---|---|
| 7,602,253 B2 | 10/2009 | Kim et al. |
| 8,415,999 B2 * | 4/2013 | Ding et al. .................... 327/157 |
| 2003/0006933 A1 * | 1/2003 | Kasperkovitz et al. ....... 342/368 |
| 2005/0104623 A1 * | 5/2005 | Guo et al. ........................ 326/82 |
| 2005/0195301 A1 * | 9/2005 | Horiuchi ....................... 348/294 |
| 2007/0013455 A1 * | 1/2007 | Roubadia et al. ............... 331/57 |
| 2008/0043818 A1 * | 2/2008 | Tal et al. ........................ 375/135 |
| 2008/0218229 A1 | 9/2008 | Cranford et al. |
| 2008/0238498 A1 * | 10/2008 | Lam et al. ..................... 327/117 |
| 2008/0279230 A1 * | 11/2008 | Dagenais ......................... 372/20 |
| 2008/0290953 A1 * | 11/2008 | Sandner et al. ................... 331/2 |
| 2008/0317185 A1 * | 12/2008 | Mueller et al. ................. 375/376 |
| 2009/0045861 A1 | 2/2009 | Hayden et al. |
| 2009/0088091 A1 * | 4/2009 | Shen et al. ..................... 455/102 |
| 2010/0166039 A1 * | 7/2010 | Jeon et al. ..................... 375/130 |
| 2011/0140767 A1 * | 6/2011 | Lin ................................ 327/536 |
| 2011/0234273 A1 * | 9/2011 | Lin et al. ....................... 327/157 |
| 2011/0304457 A1 * | 12/2011 | Bausov et al. ................. 340/552 |
| 2012/0025881 A1 * | 2/2012 | Ding et al. ..................... 327/157 |
| 2013/0147530 A1 * | 6/2013 | Ding et al. ..................... 327/157 |

* cited by examiner

HIGH FREQUENCY QUADRATURE PLL CIRCUIT AND METHOD

FIELD OF THE INVENTION

The invention relates to a circuit for transmitting and receiving signals and, more particularly, to a high frequency quadrature phase lock loop (PLL) circuit and associated method.

BACKGROUND

Quadrature networks are used in virtually all kinds of radio frequency circuits. In a quadrature network, two equal amplitude but phase-shifted output signals are generated from a single input signal. In an ideal quadrature system, the two output signals have a relative phase shift of $\pi/2$ radians (90°). Typically, quadrature networks produce an in-phase signal that leads the input signal by $\pi/4$ and a quadrature signal that lags the input signal by $\pi/4$, for a total $\pi/2$ phase difference between the two output signals.

Quadrature local oscillator (LO) signals are widely used in transmitter, receiver or transceiver systems. Low amplitude and phase errors are the basic requirements for quadrature LO signals. There are commonly three approaches for generating quadrature LO signals. A first is to use a passive or active phase shifter, or a 90-degree power divider, to split an LO signal into I (In-Phase) and Q (Quadrant) LO signals. Both the phase shifter and divider circuits are frequency dependant, meaning that they can only have the exact phase and amplitude balances at one frequency point or approximately a narrow group of frequencies by nature. Thus, the phase shifter and divider circuit approach is not robust because it is only usable for a very narrow range of frequencies. Moreover, it is generally difficult to fine tune the balances in such a system.

A second approach is to use coupled Voltage Controlled Oscillators (VCOs), in which the quadrature phase balance depends on the amplitude balance. However, this approach is disadvantageous because the phase balance suffers when the amplitudes are out of a balance due to any mismatches between the two coupled VCOs. Also, there is no mechanism for providing balance improvement in real time such that this approach does not provide a closed-loop scheme.

A third approach is to use master and slave latches to generate I and Q signals. However, this approach is difficult to implement at millimeter wave frequencies. Furthermore, this approach is disadvantageous in that it is not a closed-loop scheme.

Accordingly, there exists a need in the art to overcome the deficiencies and limitations described hereinabove.

SUMMARY

In a first aspect of the invention, there is a method comprising phase-shifting an output signal of a phase lock loop (PLL) circuit by applying an injection current to an output of a charge pump of the PLL circuit.

In another aspect of the invention, there is a method comprising referencing a first phase lock loop (PLL) circuit and a second PLL circuit to a same clock, and applying an injection current to at least one of the first PLL circuit and the second PLL circuit. The applying the injection current creates a phase difference between an output signal of the first PLL circuit and an output signal of the second PLL circuit. The method also includes detecting a deviation of the phase difference from a predetermined value, and adjusting the injection current based on the detected deviation.

In yet another aspect of the invention, there is a circuit comprising: a first phase lock loop (PLL) circuit and a second PLL circuit referenced to a same clock; a phase detector circuit that detects a phase difference between an output signal of the first PLL circuit and an output signal of the second PLL circuit; and an adjustable current source that applies an injection current to at least one of the first PLL circuit and the second PLL circuit based on an output of the phase detector circuit.

In further aspects of the invention, there is a circuit, comprising: a first phase lock loop (PLL) circuit and a second PLL circuit referenced to a same clock; a phase detector circuit that detects a phase difference between an output signal of the first PLL circuit and an output signal of the second PLL circuit; and an adjustable current source that applies a first injection current to the first PLL circuit and a second injection current to the second PLL circuit based on an output of the phase detector circuit.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of quadrature PLL circuit, which comprises the structures of the present invention. In still further embodiments, a method in a computer-aided design system is provided for generating a functional design model of the quadrature PLL circuit. The method comprises generating a functional representation of the structural elements of the quadrature PLL circuit.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to a circuit for transmitting and receiving signals, and more particularly to a high frequency quadrature PLL circuit and associated method. According to aspects of the invention, two identical phase lock loop (PLL) circuits including two identical voltage control oscillators (VCO) are used to create I and Q quadrature local oscillator (LO) signals. A phase balance closed-loop control is obtained by applying an injection current to an input of a loop filter (LPF) in one of the PLLs. The injection current generates a phase shift in one of the PLLs, which creates a phase difference between the output signals of the respective PLLs. The injection current is adjusted by a closed-loop circuit which tracks the I and Q outputs in real time. Accordingly, in embodiments, the generated I and Q signals are used in a feedback loop to adjust and control the injection current, which adjusts and controls the phase difference between the I and Q signals. In this manner, embodiments of the invention provide phase balanced I and Q signals for the full tuning range of the VCOs. Implementations of the invention provide a high frequency quadrature LO signal having better controlled I/Q skew over a wide frequency range at millimeter wave (MMW) frequencies.

In embodiments, the outputs of two PLL circuits, each referenced to the same reference clock, are connected to a quadrature phase detector. One of the PLLs is configured with a phase trimming input in the form of a current injection. The output of the quadrature phase detector is connected to the phase trimming input so as to phase lock at a 90 degree offset. The phase trimming input is a controlled current input, connected to the charge pump output of at least one of the PLLs. Implementations may involve creating a standard feedback system where an output error signal is created proportional to the offset from the desired phase relationship between two PLL controlled oscillators. The error signal is connected to a phase trimming (or phase adjusting) input on one of the PLLs.

Figure 1:
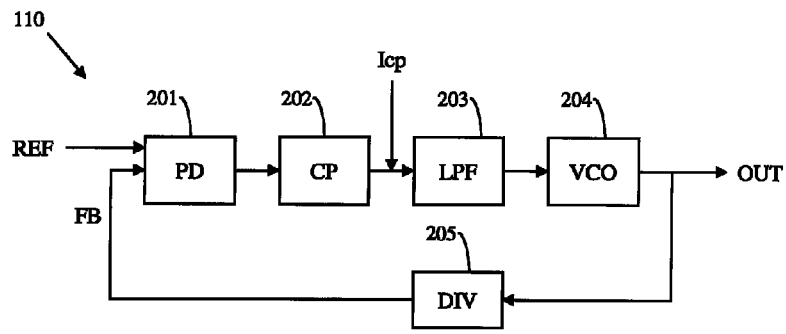
FIG. 1 shows a block diagram of a circuit in accordance with aspects of the invention.

FIG. 1 shows a block diagram of a circuit in accordance with aspects of the invention. More specifically, FIG. 1 shows a phase lock loop (PLL) circuit 110 according to aspects of the invention. In embodiments, the PLL 110 includes a phase detector (PD) 201, charge pump (CP) 202, loop filter (LPF) 203, voltage control oscillator (VCO) 204, and a frequency divider (DIV) 205. These components are understood by those of ordinary skill in the art, such that further explanation is not believed necessary.

Still referring to FIG. 1, the PLL 110 has a reference signal "REF" input, an output signal "OUT" output, and a feedback signal "FB". It is understood by those of ordinary skill in the art that when a PLL 110 is in the locking state, the average current from the charge pump 202 to the loop filter 203 is zero in one period of the reference signal, and that the lock frequency of the PLL 110 is the frequency of the reference signal REF multiplied by the divider ratio of the frequency divider 205.

According to aspects of the invention, the PLL 110 also has an additional injection current "$I_{cp}$" which is applied between the charge pump 202 and the loop filter 203. In embodiments, the injection current $I_{cp}$ is used to adjust the phase of the output signal OUT of the PLL 110. For example, when the external injection current $I_{cp}$ is added to the charge pump 202 output added (e.g., the loop filter 203 input), the charge pump 202 compensates for the injection current $I_{cp}$ in order to maintain the zero net charge into the loop filter 203 at the lock condition. The compensation by the charge pump 202 causes a phase offset between the reference signal REF and the feedback signal FB at the phase detector 201. As such, the magnitude of $I_{cp}$ drives an amount of phase adjustment of the PLL output OUT.

For example, in embodiments, when the injection current $I_{cp}$ is added to the loop filter 203 input, the charge pump 202 provides a pulsed sourcing current to balance the injection current $I_{cp}$ according to Equation 1:

$$I_{cp0}*\tau = I_{cp}*\tau_{cp} \qquad (1)$$

where: $I_{cp0}$ is a reference current of the charge pump;
  $\tau$ is a pulse width of the sourcing current of the charge pump; and
  $\tau_{cp}$ is a pulse width of the injection current.

A sourcing pulse (e.g., of the injection current $I_{cp}$) having a pulse width $\tau$ makes the PLL output edge shift of $\tau$ which is equivalent to the phase shift expressed in Equation 2:

$$\phi = \frac{\tau*N}{T_{REF}}*360° = \frac{I_{cp}\tau_{cp}}{T_{REF}I_{cp0}}*N*360° \qquad (2)$$

where: $T_{REF}$ is a period of the reference signal; and
  N is the frequency divider ratio.

Therefore, in accordance with aspects of the invention, the phase of the PLL output signal (OUT) is tuned by adjusting at least one of the magnitude of the injection current $I_{cp}$ and the pulse width $\tau_{cp}$. In embodiments, the injection current $I_{cp}$ may be applied to the PLL either as a periodic or a direct current (DC) current source.

Figure 2:
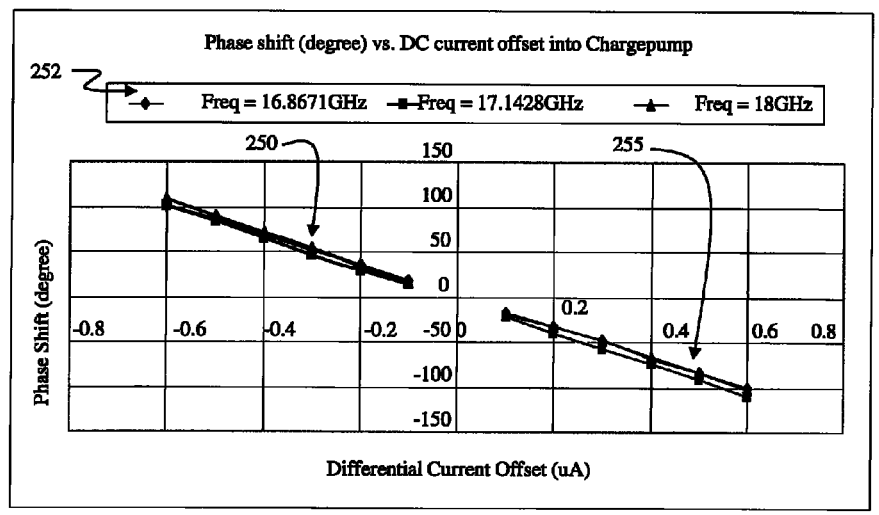
FIG. 2 shows simulation data of a phase shift obtained using the circuit of FIG. 1.

FIG. 2 shows simulation data of a phase shift obtained using the circuit of FIG. 1 in accordance with aspects of the invention. More specifically, FIG. 2 shows a plot of experimental results using a single PLL (such as PLL 110) and generating a phase shift in the PLL output signal (e.g., OUT) by applying an injection current (e.g., $I_{cp}$) between the charge pump (e.g., CP 202) and the loop filter (e.g., LPF 203). The three data plots 250 on the left side of FIG. 2 depict the phase of the PLL output signal at three PLL locked frequencies 252 when a negative injection current is applied as described herein. The three data plots 255 on the right side of FIG. 2 depict the phase of the PLL output signal at the same three PLL locked frequencies 252 when a positive injection current (e.g., $I_{cp}$) is applied as described herein. The data plots 250 and 255 show that application of an injection current, in accordance with aspects of the invention, causes a phase shift in the output signal of the PLL. In embodiments, this induced phase shift is used to generate I and Q quadrature local oscillator (LO) signals, as described in greater detail herein.

Figure 3:
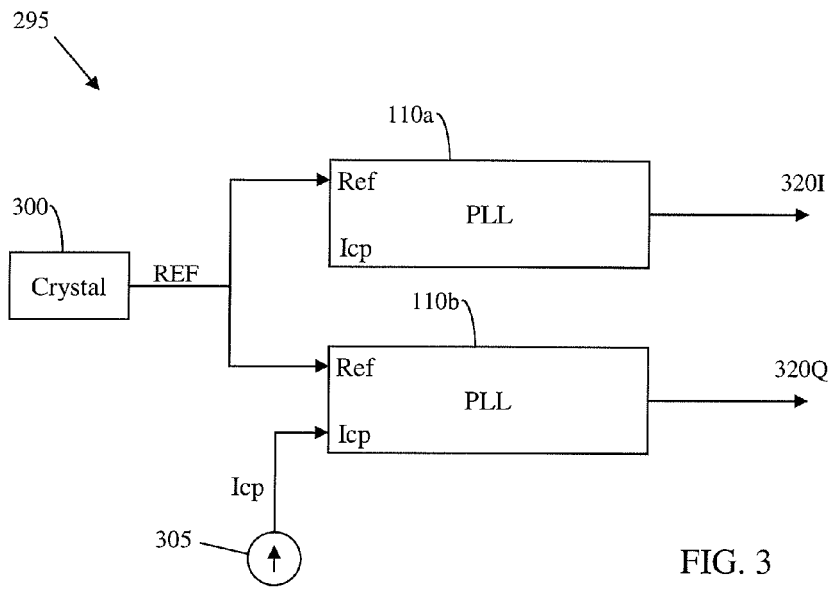
FIGS. 3-5 show block diagrams of circuits in accordance with aspects of the invention.

FIG. 3 shows a block diagram of an open-loop quadrature PLL circuit 295 in accordance with aspects of the invention. In the circuit, unit 300 is an off chip crystal oscillator that provides a reference signal (e.g., REF) to two substantially identical PLLs 110a and 110b, which may have the same components as PLL 110 described with respect to FIG. 1. In embodiments, the two PLLs 110a and 110b share the same reference signal REF and have the same charge pump reference current $I_{cp0}$. According to aspects of the invention, the difference between the two PLLs 110a and 110b is that the $I_{cp}$ input of first PLL 110a is floating, whereas the $I_{cp}$ input of the second PLL 110b is connected to a current source 305 that provides an injection current $I_{cp}$ between the charge pump and loop filter of the second PLL 110b.

In embodiments, and in a manner similar to that described above with respect to FIGS. 1 and 2, application of the injection current $I_{cp}$ to the second PLL 110b causes the output signal 320Q of the second PLL 110b to be out of phase with the output signal 320I of the first PLL 110a. In accordance with aspects of the invention, the various physical components of the circuit are configured to satisfy Equation 3 in order to make a phase difference of 90° between 320I and 320Q.

$$I_{cp}*\tau_{cp} = I_{cp0}*T_{ref}/(4*N) \qquad (3)$$

In embodiments, when the circuit is configured to satisfy Equation 3, the output signal 320Q is 90° ahead of the output signal 320I. In this manner, the output signals 320I and 320Q may be used as quadrature local oscillator (LO) signals since they are the same magnitude and frequency and 90° out of phase. In a particular embodiment, the injection current $I_{cp}$ is a DC current source when Equation 3 is satisfied and $\tau_{cp} = \tau_{ref}$, such that $I_{cp} = I_{cp0}/(4*N)$. In another embodiment, the injection current $I_{cp}$ is periodic and $\tau_{cp} = T_{ref}/2$, such that $I_{cp} = I_{cp0}/(2*N)$ and the injection current $I_{cp}$ is applied on every half cycle. In any event, implementations of the invention make it possible to adjust the phase between output signals 320I and 320Q by adjusting at least one of $I_{cp}$ and $\tau_{cp}$ as described herein. Moreover, although a phase shift of 90° is described herein for a quadrature signal, the invention is not limited to this particular phase shift, and the components of the circuit may be structured and arranged to provide any desired phase shift between output signals 320I and 320Q.

Figure 4:
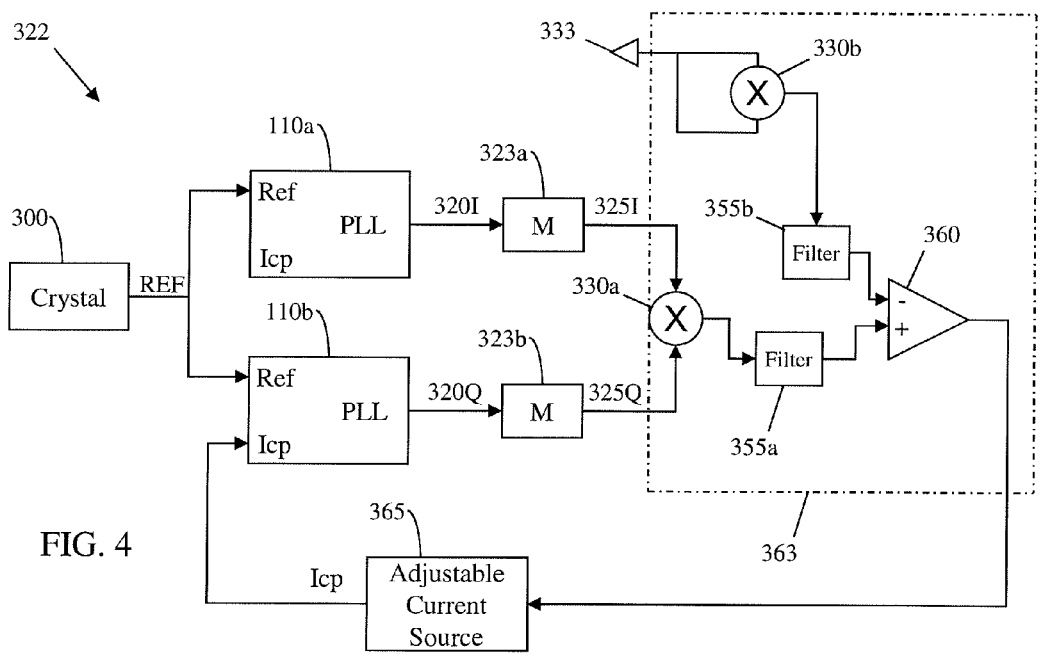

FIG. 4 shows a block diagram of a closed-loop quadrature PLL circuit 322 in accordance with aspects of the invention, in which like reference numerals refer to similar elements as those already described. In embodiments, the circuit 322 comprises an off chip crystal oscillator 300 that provides a reference signal (e.g., REF) to two substantially identical PLLs 110a and 110b. In accordance with aspects of the invention, the two PLLs 110a and 110b generate quadrature output signals 320I and 320Q when a particular level of injection current in applied to the second PLL 110b.

In embodiments, the respective output signals 320I and 320Q are inputs to substantially identical frequency multipliers 323a and 323b which raise the frequency of the output signals by a predetermined amount "M". For example, the frequency multipliers 323a and 323b may be used in implementations when the PLLs 110a and 110b operate at a frequency different than the frequency required for the local oscillator (LO) signals. The output signals 325I and 325Q of the multipliers 323a and 323b may be used as quadrature local oscillator (LO) signals.

In accordance with aspects of the invention, the output signals 325I and 325Q of the multipliers 323a and 323b are input to a first mixer 330a. When multipliers are not used, the output signals 320I and 320Q of the PLLs 110a and 110b are input to the first mixer 330a. The structure and operation of a mixer is known to those of ordinary skill in the art such that further explanation is not believed necessary.

When the inputs to the mixer 330a, e.g., signals 320I and 320Q or signals 325I and 325Q, are at frequency "f" and perfectly orthogonal, the output of the mixer 330a is a sinusoidal signal at frequency "2f" with no DC component. On the other hand, when the inputs to the mixer 330a are at frequency "f" and are not perfectly orthogonal, e.g., one signal is $\sin(2\pi ft)$ and the other signal is $\cos(2\pi ft+\theta)$, the output of the mixer 330a is given by Equation 4.

$$\sin(2\pi ft) * \cos(2\pi ft + \theta) = \frac{1}{2}\sin(2\pi*(2f)t + \theta) - \frac{1}{2}\sin(\theta) \quad (4)$$

The first term on the right side of the equal sign in Equation 4 is a high frequency component at frequency "2f." The second term on the right side of the equal sign in Equation 4, i.e., $\frac{1}{2}\sin(\theta)$, is a DC component proportional to $\theta$ when $\theta$ is small. As such, any I/Q skew from a 90° phase shift in the inputs to the mixer 330a results in a non-zero DC component at the output of the mixer 330a. In embodiments, any such non-zero DC component at the output of the mixer 330a indicates that the output signals 320I and 320Q of the PLLs 110a and 201b are not perfectly orthogonal.

In accordance with aspects of the invention, the circuit also includes a second mixer 330b with both inputs shorted to ground 333. The second mixer 330b is substantially identical to first mixer 330a in that they have the same DC operation points so that the DC bias voltages at their outputs are the same. This configuration of mixers 330a and 330b eliminates the difficulty to offset the DC level of the first mixer 330a.

Still referring to FIG. 4, the output of first mixer 330a is fed to a first low pass filter 355a, and the output of the second mixer 330b is fed to a second low pass filter 355b. In embodiments, the filters 355a and 355b are configured to filter out the high frequency component of the output of mixer 330a, such that only the DC component of the output of mixer 330a remains.

In accordance with aspects of the invention, the outputs of the filters 355a and 355b are provided as respective inputs to an operational amplifier 360. The amplifier 360 amplifies any existing non-zero DC component of Equation 4, e.g., ½ sin ($\theta$). Thus, when the PLL output signals 320I and 320Q (or signals 325I and 325Q when mixers are used) are not exactly 90° out of phase, the amplifier 360 amplifies the resulting DC component of the output of the mixer 330a. In embodiments, the output of the amplifier 360 is fed to an adjustable current source 365 that is used to supply the injection current $I_{cp}$ to the second PLL 110b, as described in greater detail herein. At least the mixers 330a, 330b and the amplifier 360 constitute a phase detector circuit 363.

The use of filters 355a and 355b is optional. In alternative embodiments, the outputs of the mixers 330a and 330b are fed directly into the amplifier 360. In such implementations, the amplifier 360 is configured as a DC amplifier that itself acts as an effective filter to filter out the high frequency component of the output of mixer 330a, e.g., the "2f" component of Equation 4. When filters are used, the filters may be considered part of the phase detector circuit 363.

According to aspects of the invention, the output of the amplifier 360 is fed to the input of an adjustable current source 365 which controls the amount of injection current $I_{cp}$ that is applied to the second PLL 110b. For example, when $\theta$ is positive, the output of the amplifier 360 is negative, and the adjustable current source 365 may decrease the injection current $I_{cp}$ in order to decrease the phase shift in order to make the output signals 320I and 320Q more orthogonal. On the other hand, when $\theta$ is negative, the output of the amplifier 360 is positive, and the adjustable current source 365 may increase the injection current $I_{cp}$ in order to increase the phase shift in order to make the output signals 320I and 320Q more orthogonal. In this manner, implementations of the invention use a real-time feedback loop based on a detected phase difference between the signals 320I and 320Q to tune the phase difference between the signals 320I and 320Q to make them substantially perfectly orthogonal. Particularly, the closed-loop PLL circuit detects any deviation from a 90° phase difference in PLL output signals 320I and 320Q, and uses this detected deviation to adjust the injection current which changes the phase difference between PLL output signals 320I and 320Q.

Figure 5:
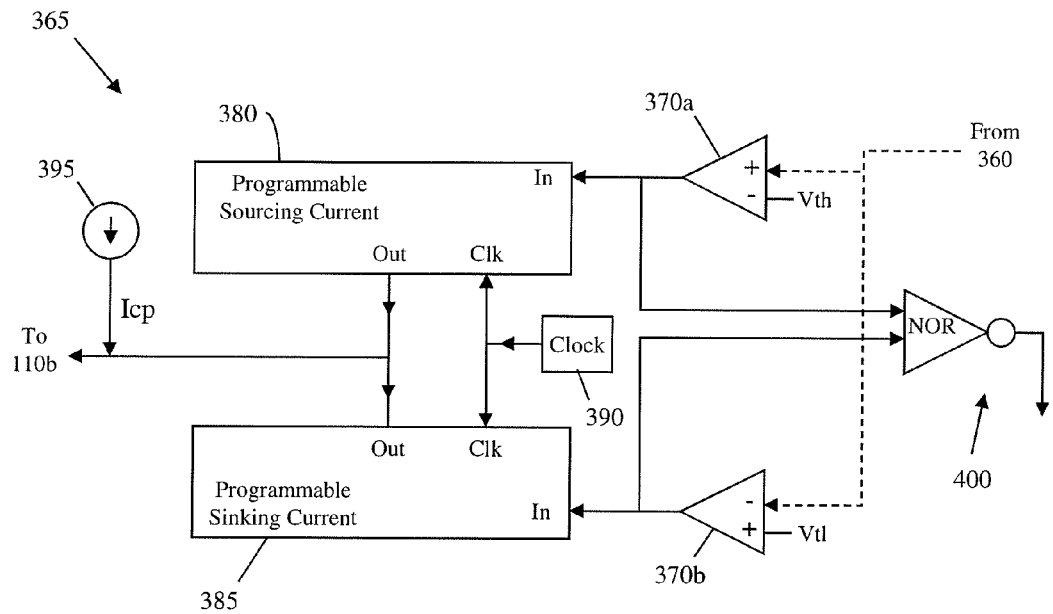

FIG. 5 depicts details of the adjustable current source 365 in accordance with aspects of the invention. In embodiments, the output from the amplifier 360 is provided as an input to a first voltage comparator 370a and a second voltage comparator 370b. A predetermined high threshold Vth is applied as another input to the first comparator 370a, and a predetermined low threshold Vtl is applied as a second input to the second comparator 370b. The magnitudes of Vth and Vtl may be based on design considerations and intended use of the circuit. In embodiments, Vth is $V_{com}$+10 mV and Vtl is $V_{com}$−

10 mV, where $V_{com}$ is the common mode voltage for Vth and Vtl; however, other values may be used within the scope of the invention.

In embodiments, the output of first comparator 370a is input to a programmable sourcing current unit 380, and the output of the second comparator 370b is input to a programmable sinking current unit 385. A clock 390 is also provided as an input to both the programmable sourcing current unit 380 and the programmable sinking current unit 385.

Still referring to FIG. 5, the adjustable current source 365 further comprises a fixed sourcing current unit 395 that generates an injection current $I_{cp}$ in accordance with Equation 3. The outputs of the programmable sourcing current unit 380 and the programmable sinking current unit 385 are coupled to the output of the fixed sourcing current unit 395 which carries the injection current $I_{cp}$.

In accordance with aspects of the invention, when the output voltage of the amplifier 360 is between the threshold voltages Vth and Vtl, the outputs of the comparators 370a and 370b are both at logic low, and neither the programmable sourcing current unit 380 nor the programmable sinking current unit 385 is activated. As such, when the output voltage of the amplifier 360 is between the threshold voltages Vth and Vtl, the phase difference between the PLL output signals 320I and 320Q is exactly 90° or is within an acceptable range of deviation defined by the threshold voltages Vth and Vtl. In this case, the adjustable current source 365 does not modify (e.g., add to or take away from) the injection current $I_{cp}$ that is generated by the fixed sourcing current unit 395.

In embodiments, when the output of the amplifier 360 is higher than the high threshold Vth, the output of the first comparator 370a is logic high which activates the programmable sourcing current unit 380. In this state, the output of second comparator 370b is logic low such that the programmable sinking current unit 385 is not activated. When the programmable sourcing current unit 380 is activated, it is configured to increase a small amount of the sourcing current for each clock cycle defined by clock 390. More specifically, the programmable sourcing current unit 380 adds current to the injection current $I_{cp}$ that is generated by the fixed sourcing current unit 395. This added current changes the amount of injection current $I_{cp}$ that is applied to the second PLL 110b, which increases the phase shift of the second PLL 110b, which changes the phase difference between the PLL output signals 320I and 320Q. This increasing of the injection current $I_{cp}$ continues until the output voltage of the amplifier 360 drops below the high threshold voltage Vth.

In embodiments, when the output of the amplifier 360 is lower than the low threshold Vtl, the output of the second comparator 370b is logic high which activates the programmable sinking current unit 385. In this state, the output of first comparator 370a is logic low such that the programmable sourcing current unit 380 is not activated. When the programmable sinking current unit 385 is activated, it is configured to increase a small amount of the sinking current for each clock cycle defined by clock 390. More specifically, the programmable sinking current unit 385 takes away (e.g., sinks) current from the injection current $I_{cp}$ that is generated by the fixed sourcing current unit 395. This sinking current decreases the amount of injection current $I_{cp}$ that is applied to the second PLL 110b, which decreases the phase shift of the second PLL 110b, which changes the phase difference between the PLL output signals 320I and 320Q. This sinking of injection current $I_{cp}$ continues until the output voltage of the amplifier 360 rises above the low threshold voltage Vtl.

In this manner, the adjustable current source 365 is configured to operate in one of three states based on a detected deviation from perfect orthogonality of the PLL output signals 320I and 320Q. In a first state, the adjustable current source 365 does not change the amount of injection current $I_{cp}$. In a second state, the adjustable current source 365 increases the amount of injection current $I_{cp}$ to increase the phase difference between the PLL output signals 320I and 320Q. In a third state, the adjustable current source 365 decreases the amount of injection current $I_{cp}$ to decrease the phase difference between the PLL output signals 320I and 320Q. As such, implementations of the invention provide a closed-loop feedback system that operates in real time to tune the phase difference between the PLL output signals 320I and 320Q based on a detected aspect of the generated PLL output signals 320I and 320Q.

In embodiments, the fixed sourcing current unit 395 is also triggered by the clock 390. In this manner, the fixed sourcing current unit 395 generates the injection current $I_{cp}$ once for every period of the clock 390. In further embodiments, the period of the clock 390 is substantially larger than the PLL closed-loop time constant to ensure good damping behavior of the current injection closed loop control system.

In further embodiments, the adjustable current source 365 comprises an orthogonal lock 400 that serves as an indicator of whether the output signals 320I and 320Q are sufficiently orthogonal for use. The orthogonal lock 400 may comprise a NOR gate that receives as inputs the respective outputs from the first and second comparators 370a and 370b. When the output of the amplifier 360 is between the thresholds Vth and Vtl, the outputs of the comparators 370a and 370b are the same, e.g., both logic low, which drives the output of the orthogonal lock 400 to logic high. On the other hand, when the output of the amplifier 360 is not between the thresholds Vth and Vtl, the outputs of the comparators 370a and 370b are not the same, e.g., one is high and one is low, which drives the output of the orthogonal lock 400 to logic low. A logic high output of the orthogonal lock 400 indicates that the output signals 320I and 320Q are sufficiently orthogonal for use as quadrature LO signals, whereas a logic low output of the orthogonal lock 400 indicates that the output signals 320I and 320Q are not sufficiently orthogonal for use. As such, in embodiments, the orthogonal lock 400 is used by the transmitting or receiving circuit as an indicator of when the output signals 320I and 320Q may confidently be used.

Figure 6:
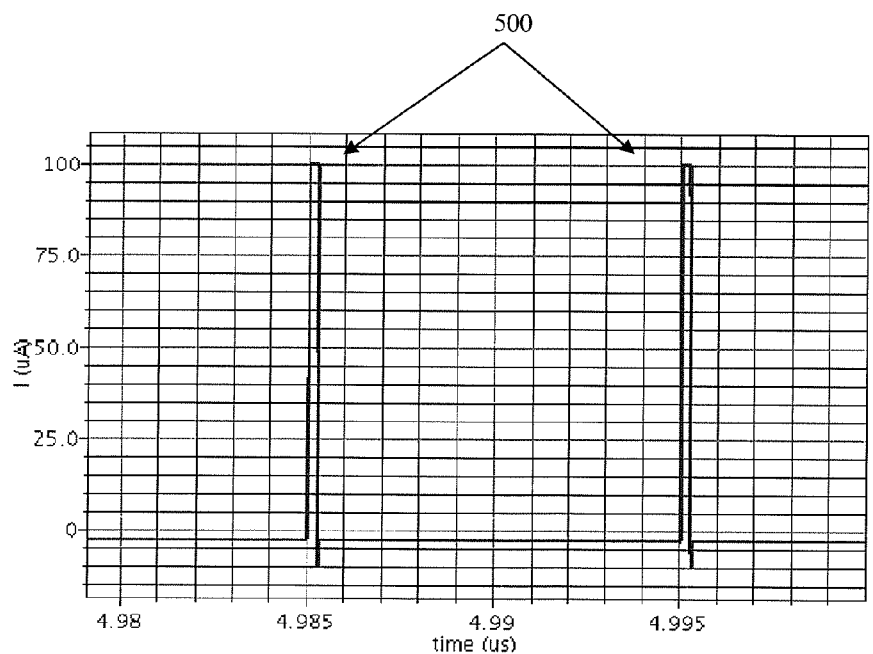
FIGS. 6-9 show simulation data associated with circuits in accordance with aspects of the invention.

FIG. 6 depicts data of a waveform of the current at the charge pump (e.g., CP 202) when the injection current $I_{cp}$ is applied to the PLL (e.g., PLL 110b) in accordance with aspects of the invention. Particularly, FIG. 6 shows that the charge pump current normally has a constant DC value of less than zero when the PLL is locked, but that the charge pump current includes spikes 500 to compensate for the application of the injection current $I_{cp}$.

Figure 7:
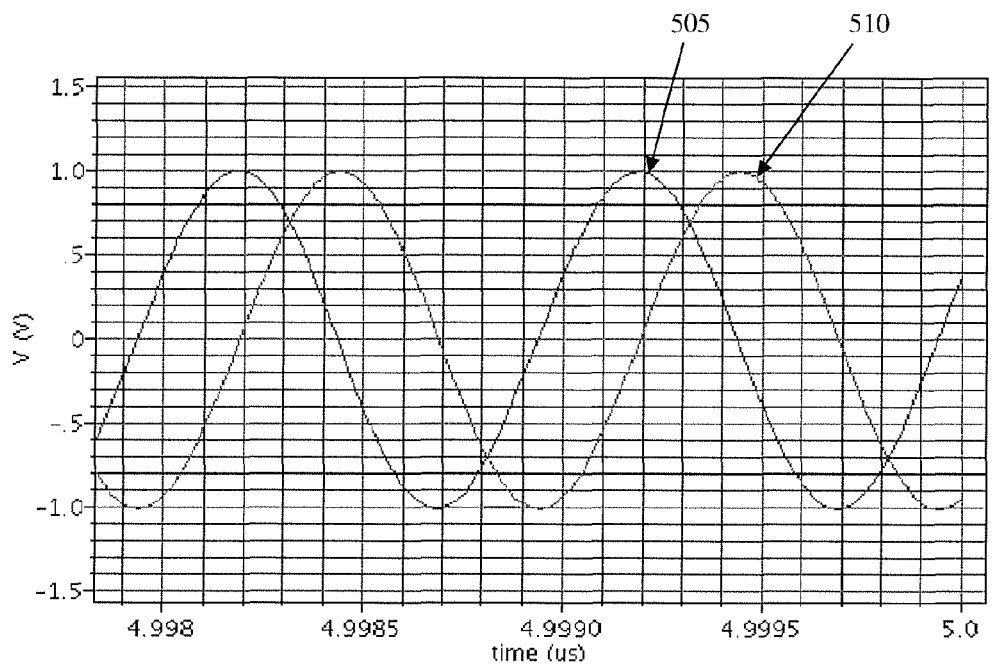

FIG. 7 depicts simulations of the output signals 320I and 320Q generated using circuits in accordance with aspects of the invention. Particularly, FIG. 7 shows output signal 320I at line 505 and 320Q at line 510. As evidenced by FIG. 7, the output signals 320I and 320Q have the same frequency and magnitude, and have a 90° phase shift.

Figure 8:
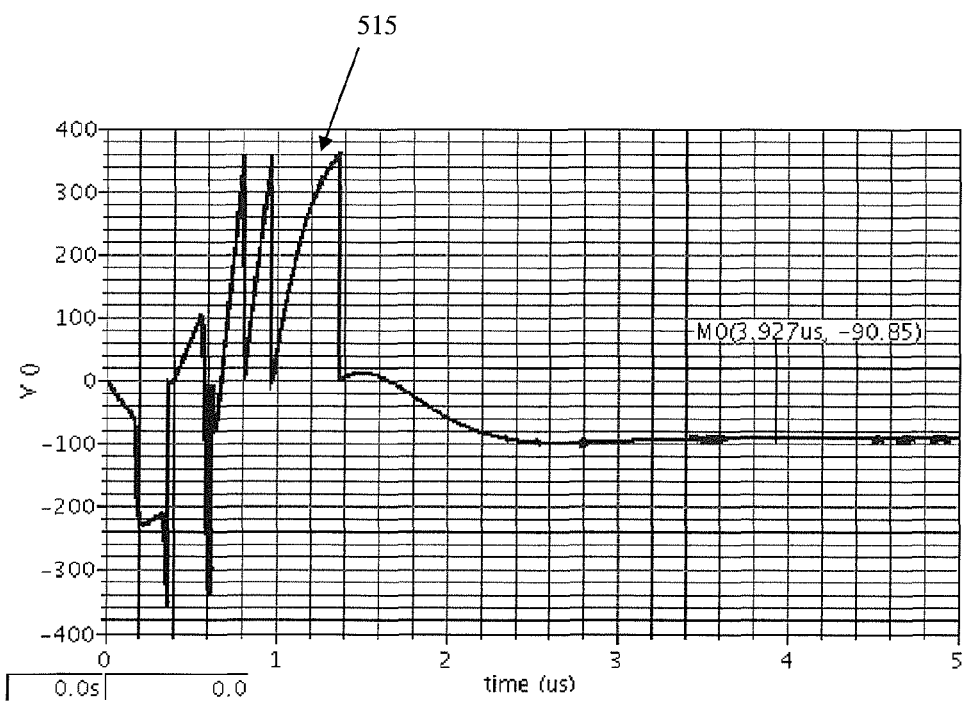
Figure 9:
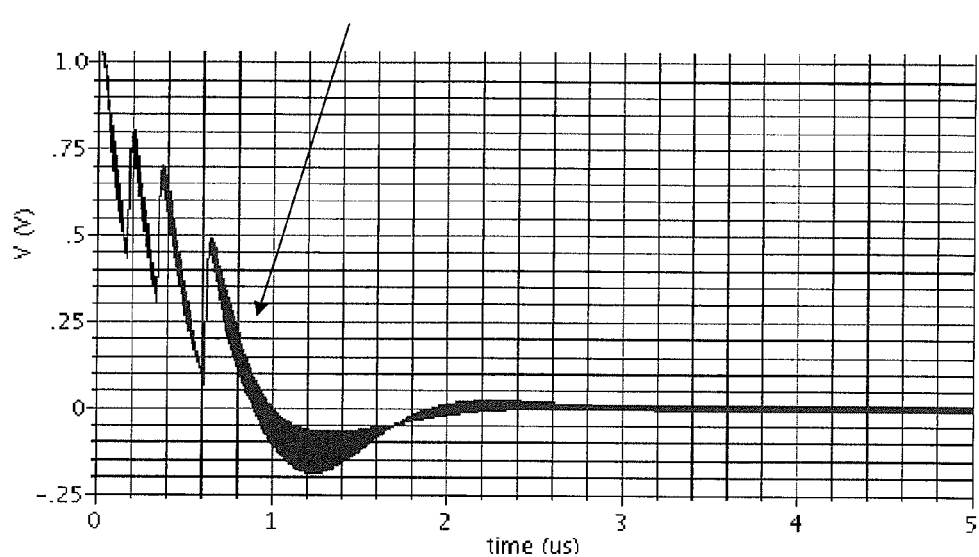

FIGS. 8 and 9 depict transient operation of the circuitry in accordance with aspects of the invention. Particularly, FIG. 8 shows an output of the phase detector 201 of the PLL 110b as a function of time, in which the transient phase waveform 515 shows the locking process of the invention. FIG. 9 shows a voltage control oscillator (VCO) tuning (e.g., filter output) voltage waveform that, like FIG. 8, depicts a transient state 520 prior to the closed-loop circuitry locking in on a desired phase shift.

Figure 10:
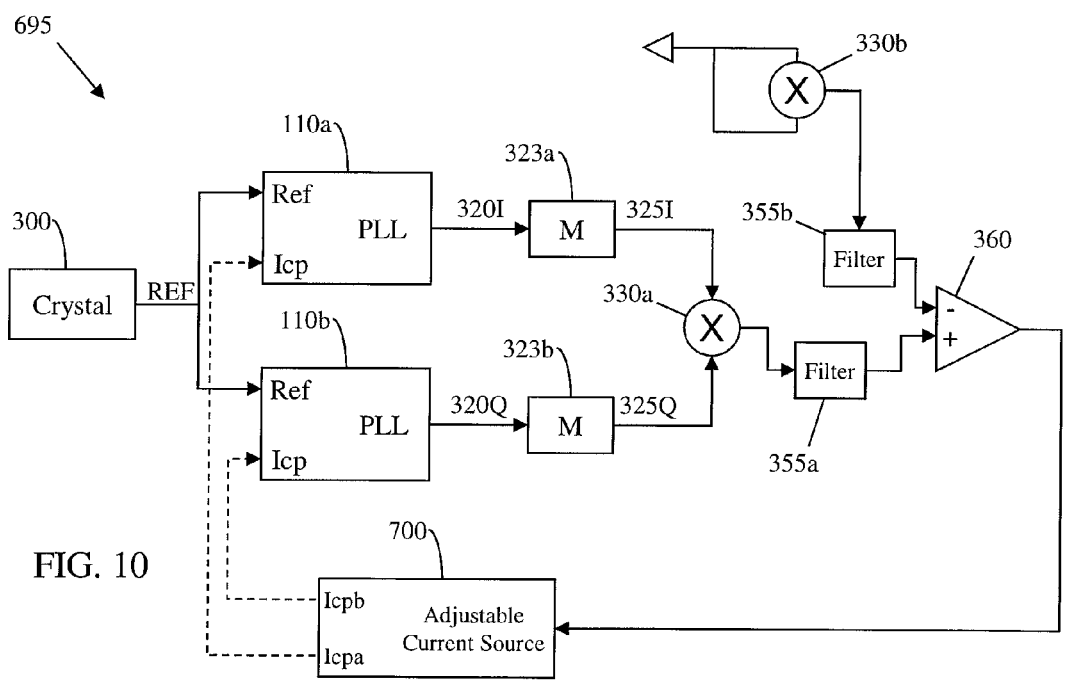
FIGS. 10 and 11 show block diagrams of circuits in accordance with aspects of the invention.

FIG. 10 shows a block diagram of a differential circuit 695 for closed-loop quadrature PLL according to aspects of the invention, in which like reference numerals indicate similar elements as those already described. The circuits described with respect to FIGS. 1-9 applied injection current $I_{cp}$ to only one PLL, e.g., the second PLL 110b. In the embodiment shown in FIG. 10, an adjustable current source 700 applies an injection current $I_{cp}$, to both the first PLL 110a and the second PLL 110b.

Figure 11:
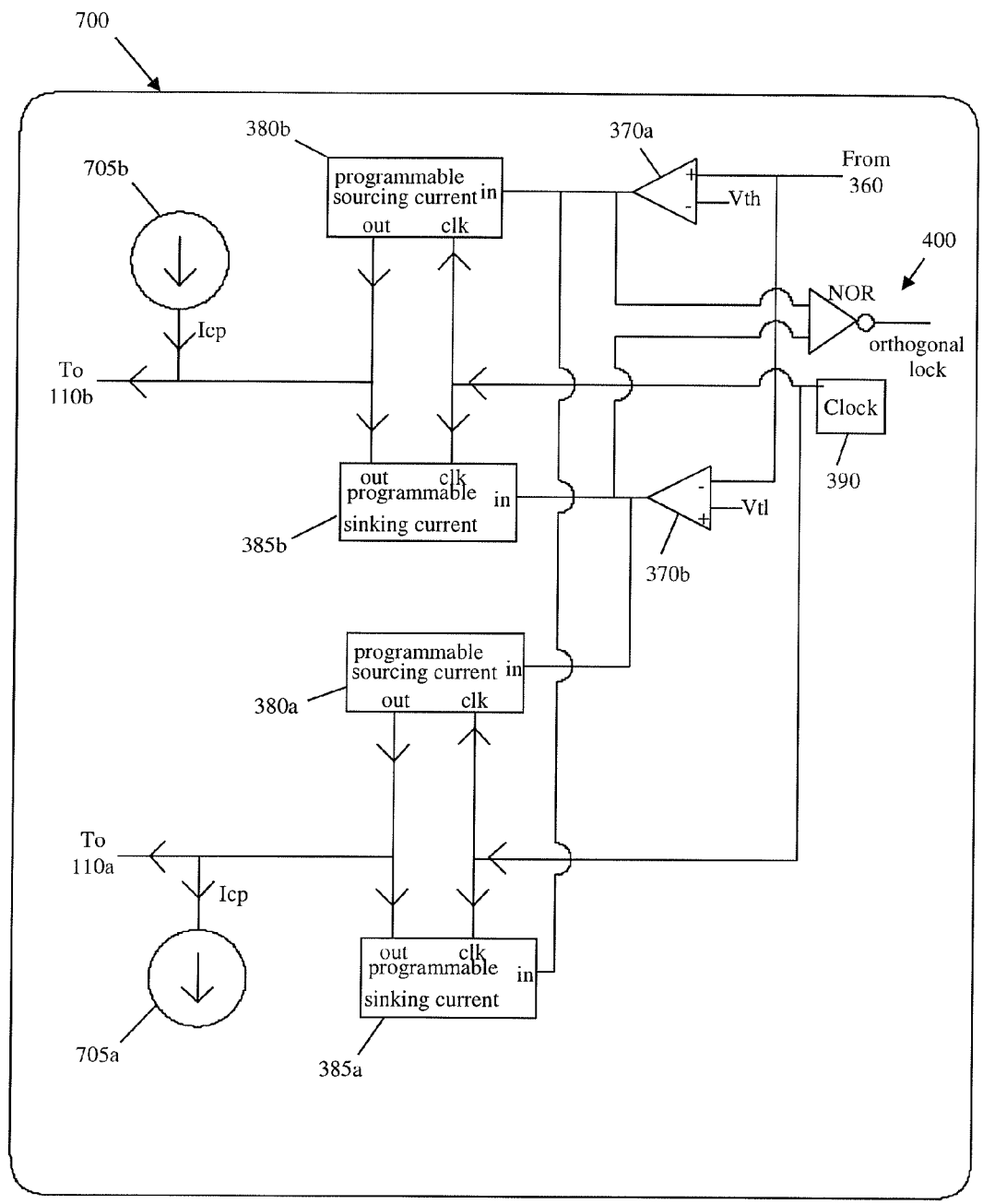

FIG. 11 shows details of the adjustable current source 700 of FIG. 10. In embodiments, the adjustable current source 700 comprises comparators 370a and 370b, clock 390, and orthogonal lock 400 similar to those described above with respect to adjustable current source 365. The adjustable current source 700 further includes current sources 705a and 705b, which each generate an identical current value of $I_{cp}$ that satisfies Equation 5.

$$I_{cp} * \tau_{cp} = I_{cp0} * T_{ref}/(8*N) \qquad (5)$$

Thus, in embodiments, current sources 705a and 705b generate an injection current $I_{cp}$ that is about half that of the injection current described above with respect to FIGS. 1-9. In accordance with aspects of the invention, current source 705a is a sourcing current of $I_{cp}$ for first PLL 110a, and current source 705b is a sinking current of $I_{cp}$ for second PLL 110b. Accordingly, current source 705a sources (e.g., adds) an amount of current equal to the injection current $I_{cp}$ at a location between the charge pump and the loop filter of the first PLL 110a, while current source 705b sinks (e.g., takes away) an amount of current equal to the injection current $I_{cp}$ at a location between the charge pump and the loop filter of the second PLL 110b.

The adjustable current source 700 also includes substantially identical programmable sourcing current units 380a and 380b and substantially identical programmable sinking current units 385a and 385b, which may be similar to the programmable sourcing current unit 380 and programmable sinking current unit 385 already described herein. In embodiments, the programmable sourcing current units 380a and 380b and the programmable sinking current units 385a and 385b have the same programmable current resolution.

In accordance with aspects of the invention, when unit 380b sources an amount of current $\Delta i$ to the $I_{cp}$ applied to second PLL 110b, unit 385a sinks the same amount of current $\Delta i$ from the $I_{cp}$ applied to first PLL 110a. Conversely, when unit 385b sinks an amount of current $\Delta i$ from the $I_{cp}$ applied to second PLL 110b, unit 380a sources the same amount of current $\Delta i$ to the $I_{cp}$ applied to first PLL 110a. In this manner, one of the PLL output signals is shifted 45° ahead of the reference phase and the other PLL output signal is shifted 45° behind the reference phase, the reference phase being the phase of the PLLs when no current injection is performed. In this manner, the output signals 320I and 320Q have a 90° phase difference in their outputs. By reducing the amplitude of the injection current $I_{cp}$ by half, the differential scheme described in FIGS. 10 and 11 results in less noise at the output.

Figure 12:
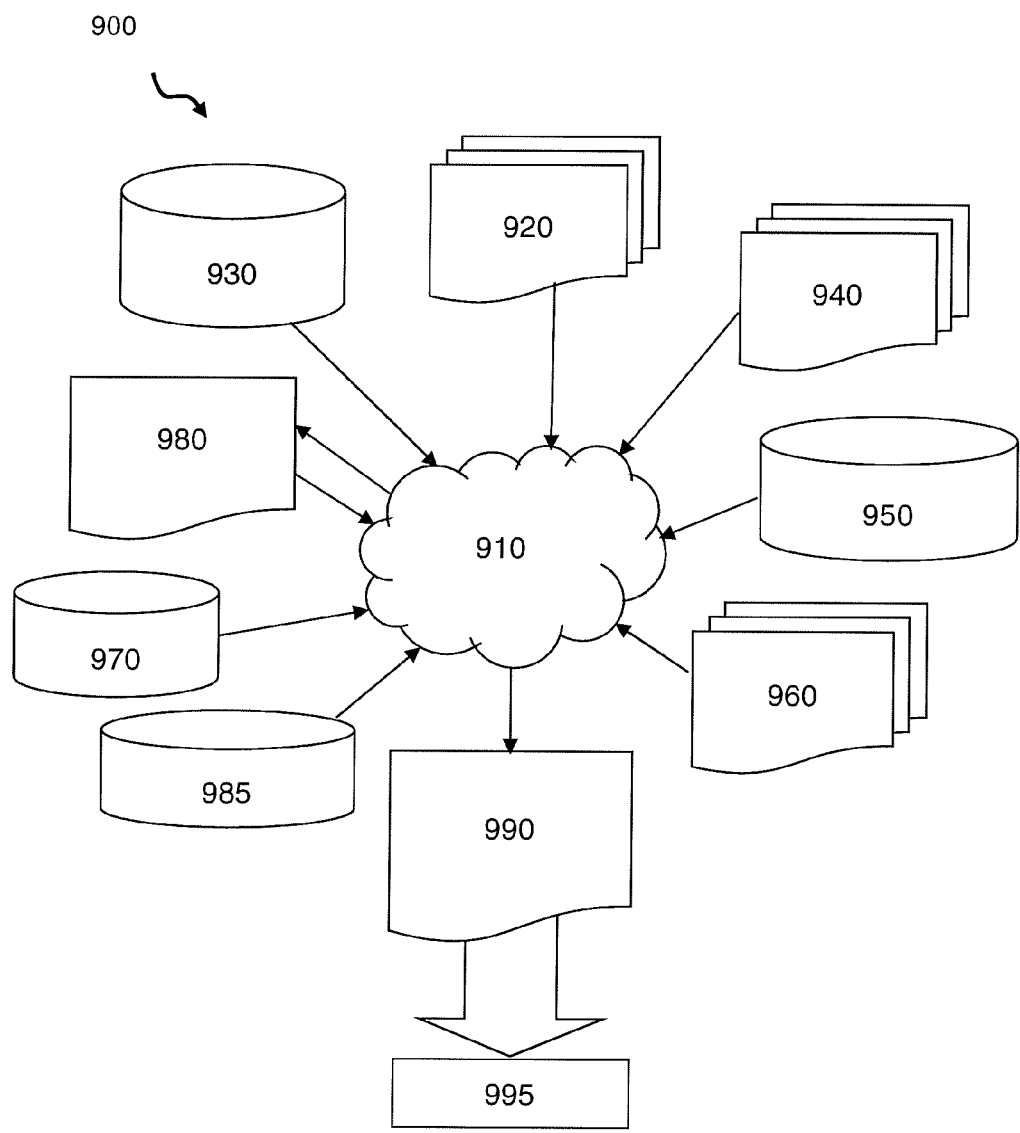
FIG. 12 is a flow diagram of a design process used in semiconductor design, manufacture, and/or test.

FIG. 12 is a flow diagram of a design process used in semiconductor design, manufacture, and/or test. FIG. 12 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1, 3-5, 10, and 11. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 12 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1, 3-5, 10, and 11. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1, 3-5, 10, and 11 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design.

Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1, 3-5, 10, and 11. In one embodiment, design structure 990 may comprise a compiled, executable HDL simulation model that functionally simulates the devices shown in FIGS. 1, 3-5, 10, and 11.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1, 3-5, 10, and 11. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims, if applicable, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principals of the invention and the practical application, and to enable others of ordinary skill in the art to understand the invention for various embodiments with various modifications as are suited to the particular use contemplated. Accordingly, while the invention has been described in terms of embodiments, those of skill in the art will recognize that the invention can be practiced with modifications and in the spirit and scope of the appended claims.

What is claimed:

1. A method, comprising:
   phase-shifting an output signal of a phase lock loop (PLL) circuit by applying an injection current to an output of a charge pump of the PLL circuit; and
   tuning a phase of the output signal of the PLL circuit by adjusting the injection current based on an output of a phase detector circuit, wherein the adjusting the injection current comprises adjusting at least one of: a magnitude of the injection current and a pulse width of the injection current.

2. The method of claim 1, wherein the adjusting the injection current comprises adjusting the magnitude of the injection current.

3. The method of claim 1, wherein the adjusting the injection current comprises adjusting the pulse width of the injection current.

4. The method of claim 1, wherein the adjusting the injection current comprises adjusting both the magnitude of the injection current and the pulse width of the injection current.

5. The method of claim 1, wherein the PLL circuit comprises: a phase detector, the charge pump, a loop filter, a voltage control oscillator, and a frequency divider.

6. The method of claim 5, wherein the phase detector circuit is separate from the phase detector included in the PLL circuit.

7. The method of claim 1, wherein the phase detector circuit is separate from the PLL circuit.

8. The method of claim 1, wherein the tuning the phase of the output signal of the PLL circuit comprises:
   providing the output signal of the PLL circuit to a mixer;
   providing an output of the mixer to a filter;
   providing an output of the filter to an amplifier;
   providing an output of the amplifier to an adjustable current source; and
   applying an output of the adjustable current source to the PLL circuit as the injection current.

9. The method of claim 8, wherein the filter comprises a low pass filter.

10. The method of claim 8, wherein the amplifier comprises an operational amplifier.

11. The method of claim 1, wherein the output signal of the PLL circuit comprises a quadrature local oscillator signal.

12. The method of claim 11, wherein the tuning comprises adjusting a phase difference between the quadrature local oscillator signal and another quadrature local oscillator signal.

13. The method of claim 1, wherein the tuning the phase of the output signal of the PLL circuit comprises providing the output signal of the PLL circuit to the phase detector circuit.

14. The method of claim 13, wherein the tuning the phase of the output signal of the PLL circuit comprises providing an output of the phase detector circuit to an adjustable current source.

15. The method of claim 14, wherein the tuning the phase of the output signal of the PLL circuit comprises applying an output of the adjustable current source to the PLL circuit as the injection current.

* * * * *